(12) United States Patent
Lenef et al.

(10) Patent No.: US 10,808,893 B2
(45) Date of Patent: Oct. 20, 2020

(54) OPTOELECTRONIC SEMICONDUCTOR LIGHT SOURCE AND BRAGG MIRROR

(71) Applicants: OSRAM Opto Semiconductors GmbH, Regensburg (DE); The Research Foundation for State University of New York, Binghamton, NY (US)

(72) Inventors: Alan Lenef, Belmont, MA (US); David Klotzkin, Vestal, NY (US); Xin Wen, Vestal, NY (US)

(73) Assignees: OSRAM Opto Semiconductors GmbH, Regensburg (DE); The Research Foundation For State University of New York, Binghamton, NY (US)

( * ) Notice: Subject to any disclaimer, the term of this patent is extended or adjusted under 35 U.S.C. 154(b) by 0 days.

(21) Appl. No.: 16/291,679

(22) Filed: Mar. 4, 2019

(65) Prior Publication Data

US 2020/0284401 A1    Sep. 10, 2020

(51) Int. Cl.
*H01L 33/46* (2010.01)
*F21K 9/68* (2016.01)
(Continued)

(52) U.S. Cl.
CPC .................. *F21K 9/68* (2016.08); *F21K 9/64* (2016.08); *F21V 7/26* (2018.02); *H01L 27/14629* (2013.01); *H01L 27/322* (2013.01); *H01L 33/46* (2013.01); *H01L 33/483* (2013.01); *H01L 33/50* (2013.01); *H01L 33/502* (2013.01); *H01L 33/507* (2013.01); *H01L 33/60* (2013.01);

(Continued)

(58) Field of Classification Search
CPC .... H01L 31/141; H01L 31/161; H01L 31/162
See application file for complete search history.

(56) References Cited

U.S. PATENT DOCUMENTS

2014/0369025 A1    12/2014  Mehl
2018/0337309 A1*   11/2018  Kopp ................... H01L 33/507
2019/0186711 A1    6/2019   Lenef et al.

FOREIGN PATENT DOCUMENTS

WO    2010/059614 A1    5/2010
WO    2017/040433 A1    3/2017

OTHER PUBLICATIONS

International Search Report dated Jul. 21, 2020, of counterpart International Application No. PCT/EP2020/055295.

* cited by examiner

*Primary Examiner* — Cheung Lee
(74) *Attorney, Agent, or Firm* — DLA Piper LLP (US)

(57) ABSTRACT

An optoelectronic semiconductor light source includes a semiconductor chip configured to emit primary radiation, a Bragg mirror, and a luminescence conversion element configured to convert at least part of the primary radiation into secondary radiation having a longer wavelength, wherein the Bragg mirror is arranged between the semiconductor chip and the luminescence conversion element, the Bragg mirror is reflective for the secondary radiation and transmissive for the primary radiation, the Bragg mirror includes reflector layers of at least three different materials with different refractive indices, the Bragg mirror includes at least two different kinds of layer pairs, each kind of layer pairs being made up of reflective layers of two different materials, and the different kinds of layer pairs having different Brewster angles for p-polarized radiation.

18 Claims, 6 Drawing Sheets

(51) Int. Cl.
    *H01L 33/60*         (2010.01)
    *H01L 33/50*         (2010.01)
    *F21K 9/64*          (2016.01)
    *H01L 33/48*         (2010.01)
    *F21V 7/26*          (2018.01)
    *H01S 5/022*         (2006.01)
    *H01L 27/146*       (2006.01)
    *H01L 27/32*         (2006.01)
    *F21Y 115/30*      (2016.01)
    *F21Y 115/10*      (2016.01)

(52) U.S. Cl.
    CPC ....... *H01S 5/02248* (2013.01); *F21Y 2115/10* (2016.07); *F21Y 2115/30* (2016.07)

OPTOELECTRONIC SEMICONDUCTOR LIGHT SOURCE AND BRAGG MIRROR

TECHNICAL FIELD

This disclosure relates to an optoelectronic semiconductor light source and a Bragg mirror for an optoelectronic semiconductor light source.

BACKGROUND

There is a need for a Bragg mirror for an optoelectronic semiconductor light source that improves light-extraction efficiency.

SUMMARY

We provide an optoelectronic semiconductor light source comprising a semiconductor chip configured to emit primary radiation, a Bragg mirror, and a luminescence conversion element configured to convert at least part of the primary radiation into secondary radiation having a longer wavelength, wherein the Bragg mirror is arranged between the semiconductor chip and the luminescence conversion element, the Bragg mirror is reflective for the secondary radiation and transmissive for the primary radiation, the Bragg mirror comprises reflector layers of at least three different materials with different refractive indices, the Bragg mirror comprises at least two different kinds of layer pairs, each kind of layer pairs being made up of reflective layers of two different materials, and the different kinds of layer pairs having different Brewster angles for p-polarized radiation.

We also provide a Bragg mirror for an optoelectronic semiconductor light source comprising a plurality of reflector layers of at least three different materials with different refractive indices, and at least two different kinds of layer pairs, each kind of layer pairs being made up of reflective layers of two different materials, wherein the Bragg mirror is reflective for at least one of green, yellow, orange and red light and transmissive for at least one of blue light, cyan-colored light and near-ultraviolet radiation, and the different kinds of layer pairs have different Brewster angles for p-polarized radiation.

Figure 1:
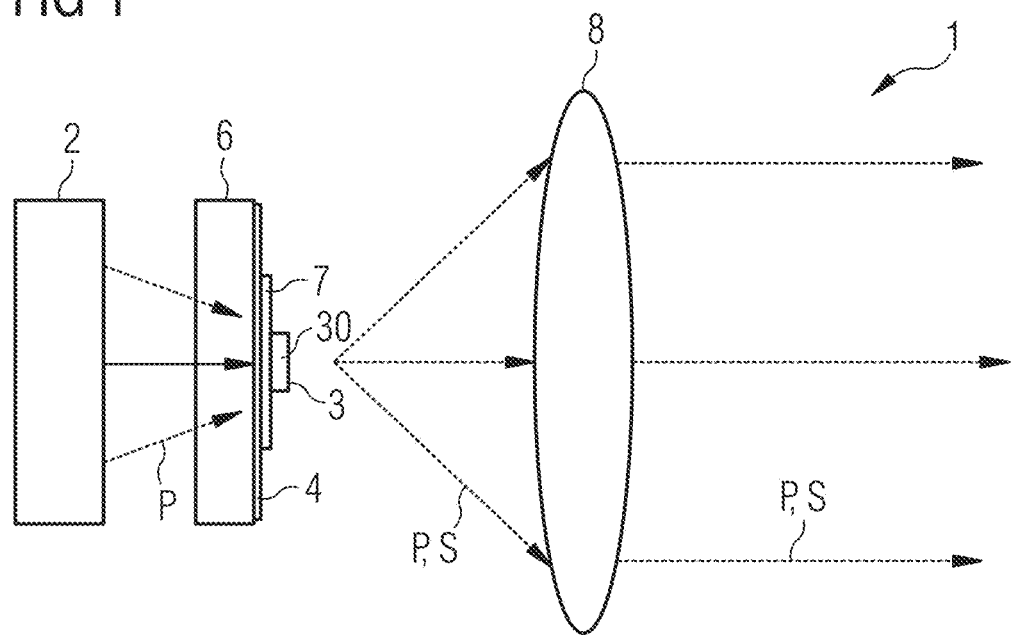
FIGS. 1, 3 and 5 show schematic sectional representations of examples of our optoelectronic semiconductor light sources.

LIST OF REFERENCE SIGNS 1 optoelectronic semiconductor light source
2 semiconductor chip
20 radiation main side
3 luminescence conversion element
30 light-exit side
4 Bragg mirror
41 reflector layer of a first material
42 reflector layer of a second material
43 reflector layer of a third material
44 reflector layer of a fourth material
45 bottom layer
46 cap layer
51 first kind of layer pair
52 second kind of layer pair
53 third kind of layer pair
6 carrier
7 adhesive
8 optical element
91 first block of layer pairs
92 second block of layer pairs
93 third block of layer pairs
A Brewster window region
B spectral region of the primary radiation
K x sin $\theta_{ph}$ where $\theta_{ph}$ is the angle of incidence in °
L wavelength in nm
N layer number
P primary radiation
R reflectivity in %
S secondary radiation
T geometric layer thickness in nm

DETAILED DESCRIPTION

Our optoelectronic semiconductor light source may comprise one or a plurality of semiconductor chips. The at least one semiconductor chip is configured to emit primary radiation. If there is a plurality of semiconductor chips, all semiconductor chips can emit primary radiation of the same spectral properties or there can be semiconductor chips emitting with different peak wavelengths, for example.

The optoelectronic semiconductor light source may comprise one or a plurality of Bragg mirrors. The at least one Bragg mirror is composed of a plurality of reflective layers. Reflectivity of the Bragg mirror and, thus, the reflective layers is preferably based on interference. Thus, the reflective layers can be of transmissive, transparent materials. The Bragg mirror is preferably electrically insulating. However, as an alternative, the Bragg mirror can also be electrically conductive.

The optoelectronic semiconductor light source may comprise one or a plurality of luminescence conversion elements. The at least one luminescence conversion element is configured to convert part or all of the primary radiation into secondary radiation. Preferably, the secondary radiation has a longer wavelength than the primary radiation. The luminescence conversion element comprises one or a plurality of phosphors. In particular, the phosphor is an inorganic material, especially a ceramic. However, in addition or alternatively, the phosphor can also be selected from an organic material. Further, quantum dots might be used as the phosphor.

For example, the phosphor is at least one of the following luminescent materials: $Eu^{2+}$-doped nitrides such as $(Ca,Sr)AlSiN_3:Eu^{2+}$, $Sr(Ca,Sr)Si_2Al_2N_6:Eu^{2+}$, $(Sr,Ca)AlSiN_3*Si_2N_2O:Eu^{2+}$, $(Ca,Ba,Sr)_2Si_5N_8:Eu^{2+}$, $(Sr,Ca)[LiAl_3N_4]:Eu^{2+}$; garnets from the general system $(Gd,Lu,Tb,Y)_3(Al,Ga,D)_5(O,X)_{12}$:RE with X=halide, N or divalent element, D=tri- or tetravalent element and RE=rare earth metals such as $Lu_3(Al_{1-x}Ga_x)_5O_{12}:Ce^{3+}$, $Y_3(Al_{1-x}Ga_x)_5O_{12}:Ce^{3+}$; $Eu^{2+}$-doped SiONs such as $(Ba,Sr,Ca)Si_2O_2N_2:Eu^{2+}$; SiAlONs for instance from the system $Li_xM_yLn_zSi_{12-(m+n)}Al_{(m+n)}O_nN_{16-n}$; nitrido-orthosilicates such as $AE_{2-x-a}RE_x-Eu_aSiO_{4-x}N_x$, $AE_{2-x-a}RE_xEu_aSi_{1-y}O_{4-x-2y}N_x$ with RE=rare earth metal and AE=alkaline earth metal; orthosilicates such as $(Ba,Sr,Ca,Mg)_2SiO_4:Eu^{2+}$; SCAP luminescent materials such as $(Sr,Ba,Ca)_5(PO_4)_3Cl:Eu^{2+}$; KSF luminescent materials such as $K_2SiF_6:Mn^{4+}$.

The Bragg mirror may be arranged between the semiconductor chip and the luminescence conversion element. This means in particular that primary radiation can reach the luminescence conversion element only after running through the Bragg mirror. One or both of the luminescence conversion element and the semiconductor chip can be arranged distant from the Bragg mirror. Otherwise, the luminescence conversion element and/or the semiconductor chip can touch the Bragg mirror.

The Bragg mirror may be reflective for the secondary radiation and may be transmissive for the primary radiation. The term 'reflective' particularly refers to a reflectivity of at least 80% or 90% or 95% or 98%. The term 'transmissive' may refer to a transmittance of at least 80% or 90% or 95% or 98%. The respective numerical values may refer to an overall photometric power of the primary radiation and the secondary radiation, respectively, incident on the Bragg mirror.

The Bragg mirror may comprise reflector layers of at least three different materials. The different materials have different refractive indices. This means that the Bragg mirror comprises a plurality of reflector layers of a first material and a plurality of reflector layers of a second material and also a plurality of reflector layers of a third material. As an option, there can be reflector layers of a fourth material and maybe of a fifth material and so on. Preferably, there are at most eight or six or four different materials for the reflector layers.

The Bragg mirror may comprise at least two different kinds of layer pairs. Each kind of layer pair may be made up of reflective layers of two different materials. This means, for example, that a first kind of layer pairs comprises at least some of the reflector layers of the first material and at least some of the reflector layers of the second material, a second kind of layer pairs may comprise at least some of the reflector layers of the second material or of the fourth material and at least some of the reflector layers of the third material.

The different kinds of layer pairs may have different Brewster angles for p-polarized radiation, in particular for p-polarized secondary radiation. The primary radiation impinges on the Bragg mirror in either s or p polarization, some combination, or random polarization.

The optoelectronic semiconductor light source may comprise a semiconductor chip configured to emit primary radiation, a Bragg mirror, and a luminescence conversion element configured to convert at least part of the primary radiation into secondary radiation having a longer wavelength. The Bragg mirror may be arranged between the semiconductor chip and the luminescence conversion element and reflective for the secondary radiation and transmissive for the primary radiation. The Bragg mirror may comprise reflector layers of at least three different materials with different refractive indices so that at least two different kinds of layer pairs are formed, each kind of layer pairs being made up of reflective layers of two different materials. The different kinds of layer pairs have different Brewster angles for p-polarized radiation.

As an intrinsic property, each kind of layer pair of two specific materials as used in a Bragg mirror has a specific Brewster angle. At the Brewster angle, reflectivity of the respective kind of layer pairs is significantly reduced and may be virtually zero for p polarized light. This means that at the Brewster angle a comparably large portion of the secondary radiation may leak through the Bragg mirror.

With the Bragg mirror described herein, by having different kinds of layer pairs with different Brewster angles, this leakage of secondary radiation can be reduced or even eliminated. Hence, an overall efficiency of the optoelectronic semiconductor light source can be increased.

The Brewster angles of the different kinds of layer pairs may differ by at least 0.5° or by at least 1° or at least 1.5° or at least 2°. Preferably, the difference is at least 2.5°. If there are more than two different kinds of layer pairs, this can be true pairwise.

At the Brewster angle of one of the different kinds of layer pairs at least one other kind of layer pairs or all other kinds of layers may pair together has/have a reflectivity for the secondary radiation of at least 20% or of at least 40% or of at least 60% or of at least 80%, in particular for p-polarized radiation. Thus, leakage of the secondary radiation at the Brewster angle can be significantly reduced or suppressed.

At an angle of incidence of 0°, a reflectivity of the Bragg mirror may be at most 2% in the wavelength range of the primary radiation. The term 'wavelength range of the primary radiation' refers in particular to that spectral range in which an intensity of the primary radiation is at least 5% or at least 2% of a peak intensity of the primary radiation.

At an angle of incidence of 0°, a reflectivity or an average reflectivity of the Bragg mirror in the wavelength range of the secondary radiation may be at least 80% or at least 90% or at least 95% or at least 98%. The term 'wavelength range of the secondary radiation' refers in particular to that spectral range in which an intensity of the secondary radiation is at least 10% or at least 5% of a peak intensity of the secondary radiation.

The Bragg mirror may be configured for high transmission of the primary radiation for angles of incidence of up to at least 30° or of up to at least 40° or of up to at least 50° or of up to at least 60°. In particular in the respective angular range, the transmittance of the Bragg mirror for the primary radiation is at all angles at least 90% or at least 95% or at least 98%. Hence, even primary radiation impinging on the Bragg mirror at relatively large angles can reach the luminescence conversion element.

However, the blueshift of the primary wavelength passband of the Bragg mirror will generally limit the angle of the incoming primary radiation. In many applications such as laser activated remote phosphor (LARP) sources, where the primary radiation may have a restricted angle, this is desireable as such a mirror will reflect primary wavelength light scattered within the converter, back into the converter, reducing loss of backscattered primary light.

The Bragg mirror may be configured for high reflectivity of the secondary radiation for angles of incidence of up to at least 65°. In particular in the respective angular range, reflectivity of the Bragg mirror for the secondary radiation may be at all angles at least 80% or at least 90% or at least 95%. Hence, even secondary radiation impinging on the Bragg mirror at relatively large angles can be reflected into the desired direction with a high efficiency.

The Bragg mirror may comprise exactly two different kinds of layer pairs. In this example, the Bragg mirror preferably comprises exactly three different materials for the reflective layers. With this configuration, while enabling cost-efficient manufacturing, a relatively high efficiency can be ensured.

The Bragg mirror may comprise exactly three different kinds of layer pairs. In particular, in this example the Bragg mirror comprises exactly four different materials for the reflective layers. With this configuration, a very high efficiency can be ensured while manufacturing costs are still comparably moderate.

The Bragg mirror may comprise at least 3 or at least 4 or at least 5 layer pairs inclusive. This can be true for one or for some or for all kinds of layer pairs. As an alternative or in addition, the number of layer pairs per kind of layer pairs is at most 40 or at most 30 or at most 20. Preferably, the number of layer pairs per kind of layer pairs is 4 to 18. This configuration enables cost-efficient manufacturing.

However, greater numbers of pairs will improve overall reflectivity of secondary light. This can also improve reflectivity of high angle primary light within the converter in the case of LARP configurations.

The secondary radiation may have a spectral width of at least 60 nm or of at least 80 nm or of at least 100 nm. As an alternative or in addition, the spectral width is at most 150 nm or at most 120 nm or at most 100 nm. Thus, the secondary radiation can be broadband radiation.

The primary radiation may have a spectral width of at most 40 nm or of at most 30 nm or of at most 15 nm or of at most 5 nm. As an alternative or in addition, the spectral width is at least 1 nm or at least 5 nm. Thus, the primary radiation can be narrowband radiation.

The term 'spectral width' may refer to a full width at half maximum, FWHM for short. Or it may also refer to a standard deviation in Gaussian-like-shaped spectra.

Within one or some or each specific kind(s) of layer pairs, thicknesses of the reflective layers of at least one of the materials vary by at least 10% or by at least 20% or by at least 30% of a maximum thickness of the respective reflective layers within the kind of layer pairs. A variation of 20%, for example, means that there is at least one reflective layer with a thickness of at most 80% of the respective maximum thickness. This means that the thicknesses of the reflective layers vary significantly. This variation applies preferably to all kinds of reflective layers. By having significantly varying thicknesses, a high reflectivity over a large angular range can be achieved.

The reflective layers may each have constant thicknesses. Thus, there are no or no significant thickness variations concerning the reflective layers. The reflective layer can be planar, but curved reflective layers are possible. The thickness is measured in a direction perpendicular to a main face of the respective reflective layer.

The different kinds of layer pairs may be arranged block by block. Thus, the different kinds of layer pairs are not intermixed with each other. It is possible that the blocks directly follow one another. Otherwise, between the blocks there can be at least one intermediate layer, in particular at most one intermediate layer.

At least 90% of the reflective layers may have a thickness of at least 0.20 L/n or at least 0.22 L/n or at least 0.24 L/n. As an alternative or in addition, at least 90% of the reflective layers have a thickness of at most 0.49 L/n or at most 0.45 L/n or of at most 0.41 L/n. n is the refractive index, in particular at 300 K, and L is the wavelength of maximum intensity for the resepective radiation to be considered, that is, the wavelength of maximum intensity for the primary radiation to be transmitted and the wavelength of maximum intensity for the secondary radiation to be reflected. Otherwise, L can be a fix wavelength like 500 nm.

The thickness of at least 10% or of at least 20% or of at least 40% or of at least 50% or of at least 70% of the reflective layers may be at least 0.28 L/n.

The thicknesses mentioned above can be true for all of the reflective layers or only for some kinds of reflective layers that is, for example, only for the reflective layers of the first and of the second material, or only for the reflective layers of some of the blocks of layer pairs.

The optoelectronic semiconductor light source may comprise a transmissive carrier. The Bragg mirror may be mounted onto the carrier. For example, the carrier is of sapphire or a glass.

The at least one semiconductor chip may be a laser diode chip. Thus, the primary radiation is coherent radiation.

The carrier may be located between the semiconductor chip and the Bragg mirror. Hence, the primary radiation runs through the carrier prior to reaching the Bragg mirror.

The primary radiation may travel through a gas or through an evacuated area prior to reaching the carrier and/or the Bragg mirror. This means that a light-exit surface of the semiconductor chip then does not touch the carrier and/or the Bragg mirror. It is possible that an optical element is arranged between the semiconductor chip on the one hand and the carrier and/or the Bragg mirror on the other hand. By such an optical element, the primary radiation can be focused onto the luminescence conversion element.

A light-exit surface of the luminescence conversion element may be small. For example, the size of the light-exit surface may be at most 1 $mm^2$ or 0.1 $mm^2$ or 0.02 $mm^2$. Thus, a point-like light source with a high luminous density can be achieved. Preferably, the light-exit surface is the only surface from which the secondary radiation, and as an option the primary radiation, is emitted from the luminescence conversion element, the carrier and the Bragg mirror.

The optoelectronic semiconductor light source may further comprise an adhesive. For example, the adhesive comprises or consists of a polymer such as a silicone and/or of a glass such as a so-called low-temperature glass with a softening temperature of at most 350° C. In a polymer, in particular a silicone, the adhesive may be filled with a filler such as glass particles or metal oxide particles to adjust the refractive index, a coefficient of thermal expansion and/or a thermal conductivity.

By the adhesive, the semiconductor chip can be attached to the Bragg mirror, or the Bragg mirror can be attached to the carrier, or the luminescence conversion element can be attached to the carrier and/or the Bragg mirror. It is possible that the light source comprises more than one adhesive. In particular, the adhesive is an optical adhesive, that is, the primary radiation and/or the secondary radiation has/have to pass the at least one adhesive prior to leaving the light source. For example, the primary radiation runs through the adhesive prior to reaching the Bragg mirror.

The at least one semiconductor chip may be a light-emitting diode chip. Thus, the primary radiation is incoherent radiation.

The adhesive may have a low refractive index, in particular at most 1.41 or at most 1.45 or at most 1.48 or at most 1.55. This can be true at a wavelength of 500 nm and at a temperature of 300 K. As an alternative, the adhesive has a high refractive index of at least 1.65 or of at least 1.8.

The above-mentioned refractive indices may refer to a wavelength of 500 nm and to a temperature of 300 K.

The adhesive may be thin. Hence, the thickness of the adhesive is preferably at least 0.2 µm or at least 0.5 µm. As an alternative or in addition, the thickness of the adhesive is at most 2 µm or at most 4 µm or at most 10 µm.

The Bragg mirror can be directly deposited on to the semiconductor light source or luminescent conversion element via a number of known methods, including physical vapor deposition, chemical vapor deposition, e-beam evaporation, sputtering, atomic layer deposition, some combination of these methods, or other thin film deposition techniques.

The Bragg mirror may form a cage all around the luminescence conversion element except for the light-exit side of the luminescence conversion element. In particular, the luminescence conversion element may be of prismatic shape and the Bragg mirror covers five of six sides of the cuboid.

The luminescence conversion element may be a ceramic body, in particular a ceramic platelet. Thus, the luminescence conversion element can be highly thermally conductive. The luminescence conversion element can be of plane-parallel shape. Seen in top view onto the light-exit side, the luminescence conversion element may be rectangular or hexagonal or circular.

The secondary radiation may be green light and/or yellow light and/or orange light and/or red light. As an alternative or in addition, the primary radiation is blue light and/or cyan-colored light and/or near-ultraviolet radiation. Near-ultraviolet radiation particularly refers to peak wavelengths of at least 340 nm and at most 405 nm. When combining blue primary radiation and green/yellow/orange secondary radiation, white light may be emitted by the light source.

The reflector layers may be metal oxides or semiconductor oxides. Binary as well as ternary or quaternary oxides can be used. For example, the materials of the reflector layers may be at least one selected from: $SiO_2$, $Ta_2O_5$, $MgF_2$, ITO, ZnO, $CaF_2$, $BaF_2$, $Al_2O_3$, $TiO_2$, $ZrO_2$, $Y_2O_3$, $HfO_2$, $In_2O_3$, and $Nb_2O_5$.

Moreover, a Bragg mirror for an optoelectronic semiconductor light source is provided. Preferably, the Bragg mirror is configured like the Bragg mirror of the optoelectronic semiconductor light source as explained in conjunction with the examples described above. Thus, features for the Bragg mirror are also disclosed for the optoelectronic semiconductor light source and vice versa.

The Bragg mirror may comprise a plurality of reflector layers of at least three different materials with different refractive indices, and at least two different kinds of layer pairs, each kind of layer pairs being made up of reflective layers of two different materials. The Bragg mirror is reflective for at least one of green, yellow, orange and red light and transmissive for at least one of blue light, cyan-colored light and near-ultraviolet radiation. The different kinds of layer pairs have different Brewster angles for p-polarized radiation.

The Bragg mirror and the optoelectronic semiconductor light source described herein are used, for example, in head lamps for vehicles such as cars, spot lights, stage lighting, or medical applications such as endoscopes or curing substances. Further, applications in the field of spectroscopy are also possible.

The optoelectronic semiconductor light sources and Bragg mirrors described herein are explained in greater detail below by examples with reference to the drawings.

Elements which are the same in the individual figures are indicated with the same reference numerals. The relationships between the elements are not shown to scale, however, but rather individual elements may be shown exaggeratedly large to assist understanding.

Many solid-state lighting (SSL) applications require high luminance and high luminous flux. Applications include projection, automotive lighting, stage lighting, medical and the like. Often, these applications require luminance that exceeds the capabilities of LEDs. The LARP (Laser Activated Remote Phosphor) approach can generate much higher luminance than LEDs, and can do so at high power levels. Because of the low étendue of a LARP source, such light sources can couple greater power or luminous flux into these etendue-limited applications.

One such transmissive LARP system 1 is shown in the example of FIG. 1. A focused pump beam of primary radiation P, preferably generated by one or more semiconductor chips 2 realized as blue laser diodes, for example, is incident on a luminescence conversion element 3, which is bonded to a transparent substrate 6 by an adhesive 7. Usually, the carrier 6 is of a material of high thermal conductivity, for example, sapphire.

The small luminescent region pumped by the laser radiation P from the semiconductor chip 2 emits secondary radiation S in both forward and backward (towards the pump) directions. However, only the light in the forward direction is collected by the projection system optics 8. While the configuration in FIG. 1 is primarily for laser excitation, also focused light from an LED can be used, albeit with greater étendue of the pump light P or possibly greater losses from LED light collection losses.

As shown in FIG. 1, a dichroic Bragg mirror 4 is used to redirect the backwards emitted luminescence into the desired forward direction. Without such a dichroic Bragg mirror 4, around half of the luminescence of the secondary radiation S goes back toward the semiconductor chip 2, resulting in low overall conversion efficiency. It is also advantageous to avoid having secondary radiation S or even scattered pump light P in the carrier 6. Otherwise, the light P, S will spread laterally beyond the desired small area luminescent region, thus increasing étendue. This will degrade the desired high luminance emission. The luminescent region of the light source 1 is limited to a light-exit side 30 of the luminescence conversion element 3.

Light generated within the luminescence conversion element 3 should also escape the total internal reflection (TIR) condition at the emitting surface 30 because the converter material usually has a relatively high refractive index compared to the output medium which is usually air. This extraction problem is usually mitigated by introducing controlled volume and/or surface scattering to couple the TIR modes into the extractable output modes.

The dichroic Bragg mirror 4 is in fact part of the light extraction solution. However, these TIR effects at surfaces and additional scattering needed for light extraction create relatively strong cavity effects within the luminescence conversion element 3 that enhance any small amount of blue or converted light transmission through the dichroic Bragg mirror 4. Equivalently, the dichroic Bragg mirror 4 "sees" multiple ray bounces from the light within the luminescence conversion element 3, amplifying the loss effects occurring from the non-ideal reflecting characteristics of a real dichroic.

Therefore, high overall conversion efficiency or efficacy in the LARP system 1 shown in FIG. 1 requires a dichroic Bragg mirror 4 with very high reflectivity over the desired wavelength range and all angles of incidence within the luminescence conversion element 3. At the same time, the dichroic Bragg mirror 4 should also transmit the partially collimated shorter wavelength pump light P, to maximize coupling of pump light P into the luminescence conversion element 3.

Figure 2:
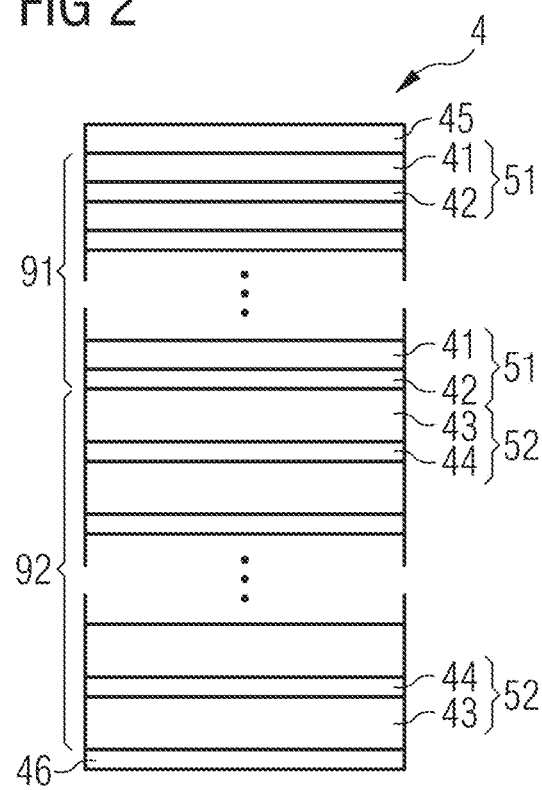
FIG. 2 shows a schematic sectional representation of an example of our Bragg mirror for optoelectronic semiconductor light sources.

In FIG. 2, the Bragg mirror 4 is illustrated in more detail. The Bragg mirror 4 comprises first reflector layers 41 of a first material, second reflector layers 42 of a second material, third reflector layers 43 of a third material and fourth reflector layers 44 of a fourth material. The first an second layers 41, 42 are grouped to layer pairs 51 of a first kind, the third an fourth layers 43, 44 are grouped to layer pairs 52 of a second kind.

All the first layer pairs 51 are arranged in a first block 91, and the second layer pairs 52 are arranged in a second block 92. The blocks 91, 92 are arranged directly on top of one another. All layers 41, 42, 43, 44 are of constant thickness. The thickness of the layers 41, 42, 43, 44 is around or slightly above $\lambda/4$ wherein $\lambda$ is in particular a peak wavelength of the secondary radiation S.

As an option, the Bragg mirror 4 can comprise a bottom layer 45 and/or a cap layer 46. The layers 45, 46 can be of the same or of different materials as/than the layers 41, 42, 43, 44. For example, the layers 45, 46 can serve as protective layers or as coupling layers. Unlike FIG. 2, there can also be an intermediate layer between the blocks 91, 92.

Thus, in one example, multiple pairs of one set of Bragg materials are followed by multiple pairs of a second set of Bragg materials. In another example, the different pairs of materials are interleaved. It is also possible that different layer pairs can be alternated next to each other.

Figure 3:
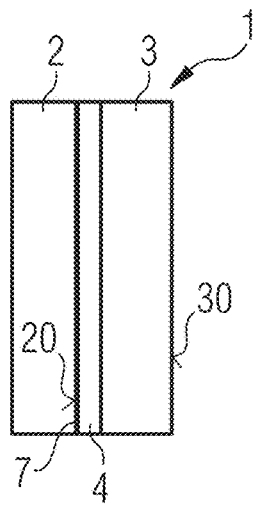

Other configurations of the light source 1 can also make use of dichroic coatings 4 with very high reflectivity over a wide angular range. One such example is shown in FIG. 3, where the luminescence conversion element 3 is used with an LED chip 2 for either white light (partial transmission of the short wavelength LED light through the luminescence conversion element 3) or full conversion, where the LED pump light P is fully absorbed by the luminescence conversion element 3. The dichroic Bragg mirror 4 functions to enhance the back-reflection of the longer wavelength converted light S towards the forward emitting direction. The Bragg mirror 4 also decouples the backward directed converted light from the LED 2, making the efficacy of the device 1 less sensitive to the LED chip 2 structure.

The Bragg mirror 4 can be directly applied to a ceramic platelet constituting the luminescence conversion element 3. The adhesive 7, for example, a thin layer of a silicone glue, is located between a radiation main side 20 of the semiconductor chip 2 and the Bragg mirror 4.

Figure 4:
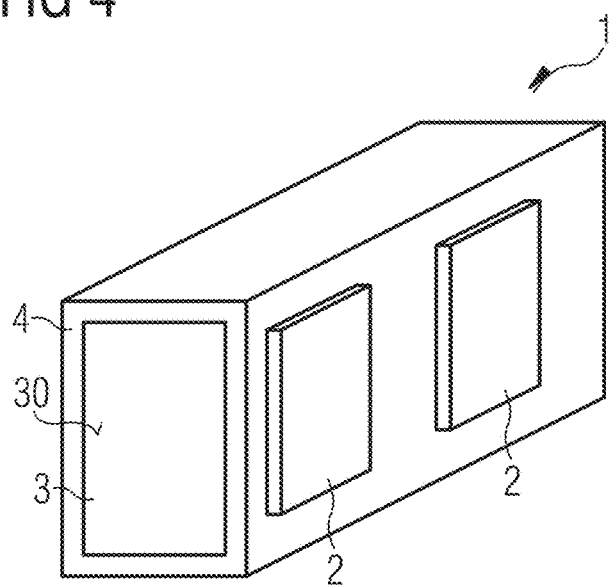
FIG. 4 shows a schematic perspective representation of an example of our optoelectronic semiconductor light source.

A related application is shown in FIG. 4. The luminescence conversion element 3 may be a high thermal conductivity material such as a ceramic YAG:Ce that fully absorbs the pump light P from the bonded LED chips 2 and emits longer wavelength light through only one emission surface 30. The luminescence conversion element 3 is a cuboid, for example.

The LED chips 2 can be located on more than one side surface, other than shown in FIG. 4. For example, a plurality of LED chips 2 are located on two opposing side surfaces and/or on a back surface and/or on top and bottom surfaces. The light-exit side 30 may be one of the smallest side surfaces of the luminescence conversion element 3. All sides of the luminescence conversion element 3 except for the light-exit side 30 are coated with the Bragg mirror 4. It is possible that the respective surfaces are covered with the LED chips 2 by at least 50% or 70%.

Figure 5:
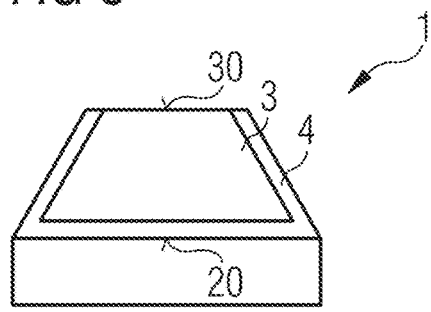

According to FIG. 5, the luminescence conversion element 3 becomes narrower in the direction away from the semiconductor chip 2. The luminescence conversion element 3 can completely cover the semiconductor chip 2. All surfaces of the luminescence conversion element 3 are coated with the Bragg mirror 4 except for the light-exit side 30. Such a configuration with a narrowing luminescence conversion element 3 can be used in all other examples. There can be more than one semiconductor chip 2 at the bottom side of the luminescence conversion element 3.

Such configurations as shown in FIGS. 4 and 5, for example, can emit light with lower étendue than that of the combined étendue of the semiconductor chips 2. Equivalently, the device 1 can generate higher luminance than physically allowable from the semiconductor chips 2 with chip-level conversion (CLC) placed in a flat array where the semiconductor chips do not optically couple together. As with the LARP converter, high efficacy or efficiency can particularly be obtained if the entire ceramic phosphor 3 is coated with a very high reflective material, that is the Bragg mirror 4, on all surfaces except for the desired emitting surface 30. In one example, the semiconductor chips 2 themselves can serve as reflectors, but a masked dielectric 4 can be required on all other regions of the ceramic phosphor 3 except for the emitting side.

Alternatively, the masking step can be eliminated by using a high reflective dichroic coating 4 that allows passage of the blue pump light P. This means that the blue pass region functions over a large angular range. In using a masking step, it is also possible to use an enhanced metallic coating for wide angular range reflection. However, metallic coatings are always lossy and therefore could limit the efficiency of the device 1.

Therefore, a need exists in SSL for a dichroic coating 4 that allows passage of short wavelength light P and reflects longer wavelength light S with very high transmission and very high reflectivity, respectively. As the secondary light S is incoherent, it consists of equal fractions of s- and p-polarized waves. A unique feature of the coating 4 is that it ideally has omnidirectional reflection of the longer wavelength light S, while having very high transmission for the short wavelength light P over at least a limited angular range. When LED pumping is used, the transmission of the short wavelength light P must also be omnidirectional. Finally, in some SSL applications, it may also be desirable to reflect both the longer wavelength converted light and the shorter wavelength pump light P with very high omnidirectional reflectivity.

Achieving omnidirectional reflectivity especially in configurations such as shown in FIG. 1 or 3 is particularly challenging because the refractive index of the carrier 6 in FIG. 1 or the adhesive layer 7 in FIG. 3 is often not too different from the phosphor refractive index. This implies that one cannot take full advantage of TIR effects to improve high angle reflectivity of the luminescence generated in the phosphor 3.

Furthermore, for p-polarized radiation, most multi-layer dielectric coatings display a strong Brewster angle transmission window that cannot be easily suppressed and therefore limits the achievable omnidirectional reflectivity of the coating. Because of the cavity effects within the phosphor 3, even small losses of reflectivity will limit the maximum achievable efficacy or efficiency of these light sources. By the Bragg mirror 4 described herein, improvements on the omnidirectional reflectivity of the dichroic behavior in applications such as shown in FIGS. 1, 3, 4 and 5 are possible by using more than the typical two dielectric coating materials in special thin film dielectric designs that suppress the Brewster transmission window.

Prior to availability of the present Bragg mirror 4, the problem of designing and fabricating a short wavelength transmitting layer and a longer wavelength reflecting layer for a transmissive LARP configuration such as shown in FIG. 1 was solved by using a two-material dielectric stack based on low and high refractive index materials. For example, the low index material could be $SiO_2$ and the high index material could be $Ta_2O_5$. Some limitations to materials often exist, especially for LARP applications, where the bonding material could be a glass which requires high-temperature bonding. The dichroic stack consists of 40-60 layers, for example, which provide a compromise between high omnidirectional reflectivity of the converted wavelengths and avoiding too high a thermal resistance to minimize phosphor temperatures.

Figure 8:
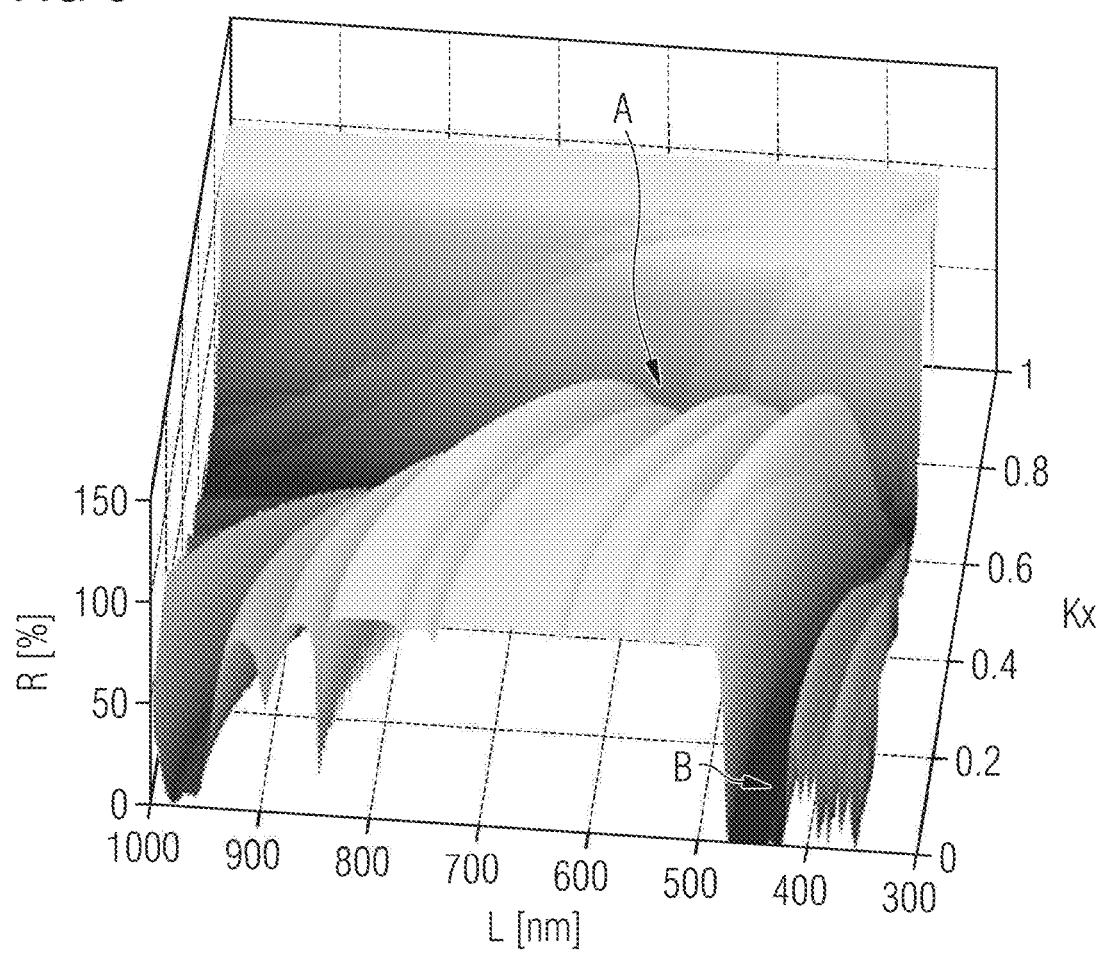
FIG. 8 shows a representation of reflectivity of p-polarized radiation for a two material Bragg mirror with the corresponding Brewster angle region, used in a configuration such as in FIG. 1.

Adequate structures require global control algorithms to generate non-periodic structures with the appropriate wavelength passband and highest possible reflectivities. That approach unfortunately has limitations due to the Brewster transmission window. FIG. 8 shows a typical simulated reflectance plot for the dichroic/glass bonding layer in the transmissive LARP configuration shown in FIG. 1. In the spectral region B, the pump light P is located. $Kx=\sin\theta_{ph}$ where $\theta_{ph}$ is the angle of incidence on the combined adhesive layer 7—dichroic 4 for light rays generated within the phosphor 3.

The results show how reflectivity varies with both wavelength and angle of incidence from the phosphor to the bonding—dichroic stack, for p-polarized light. The Brewster effect is quite clear in region A, showing a reflection minimum near 0% with $K_x \approx 0.6$ to 0.7. The Brewster angle $\theta^B_{ph}$ for the stack, as seen by the phosphor, can be determined by Equation (1):

$$K_x = \sin\theta^B_{ph} = \frac{1}{n_{ph}}\frac{n_1 n_2}{\sqrt{n_1^2 + n_2^2}} \quad (1)$$

wherein $n_1$ and $n_2$ are the refractive indices for the two different dielectric stack materials. The symbol $n_{ph}$ denotes the refractive index of the phosphor 3. For example, at 550 nm with a YAG phosphor ceramic ($n_{ph}=1.84$) and dielectric coating materials of $SiO_2$ and $Ta_2O_5$ ($n_1=1.48$ and $n_2=2.20$), $K_x=0.67$, in agreement with the simulated result.

Also, for the configuration in FIG. 1, for nearly any carrier material, a TIR condition between the phosphor and carrier—dichroic interface cannot be achieved at the Brewster angle transmission window. This can be seen since the transverse wave vector $K_x$ must be conserved through all materials, including the dielectric stack, the adhesive layer 7, the carrier 6, and the phosphor 3. Therefore, if light is incident within the phosphor 3 at the Brewster angle $\theta^B_{ph}$, then the light will be transmitted if $k^B_x < k_{sub}$, or equivalently, in Equation (2):

$$\frac{k^B_x}{k_0} = n_{ph}\sin\theta^B_{ph} = \frac{n_1 n_2}{\sqrt{n_1^2 n_1^2}} < n_{sub} \quad (2)$$

where $n_{sub}$ is the refractive index of the carrier. For the example considered, $k^B_x/k_0=1.23$. Therefore, for both a glass substrate ($n_{sub}=1.51$ for borosilicate) or a sapphire substrate ($n_{sub}=1.77$), Brewster angle luminescence from the phosphor 3 will be transmitted into the carrier, for any two-material dichroic. For SSL sources such as the LARP configuration, this results in trapped light within the carrier that will spread the effective emission spot, reducing luminescence. This is highly undesirable for applications such as LARP. At the Brewster window, light will exit the substrate and will not be converted or used.

By employing three or more materials in the dichroic 4, it is possible to create two different dielectric stacks with different Brewster windows, that is different material layer pairs such that $k^B_x/k_0$ in Equation (2) has two different non-overlapping transmission windows, closing off the Brewster window. In doing so, it is possible to improve the overall omnidirectionally averaged reflectivity. In LARP or aperture lamp configurations, this improved reflectivity is further enhanced due to cavity effects of the partially trapped luminescence, thereby significantly increasing the overall efficiency or efficacy of the SSL source.

The advantage of the Bragg mirror 4 described herein can be expressed by calculating the photon-to-photon conversion factor, comparing a conventional single Bragg stack design to a multiple material pair, Bragg stack design. This conversion factor is the merit function used by the algorithms that design the details of the coatings. It is a number between zero and one that represents the fraction of input photons not converted to secondary light coupled out at the front surface 30. For example, a merit function (metric value) of 0.2 implies 80% of input photons are converted to output photons exiting from the target facet in FIG. 1.

Table 1 below shows results from a benchmark design with two materials compared to a three-material design of the same total number of layers (that is, 60 layers), but designed using both pairs of materials to cover the Brewster window. All characteristics are improved: the passband (blue pump light P) transmission is slightly more, the stopband (dichroic) is slightly more, and the overall conversion efficiency is improved by about 18%. This is a very significant improvement.

TABLE 1

|  | Benchmark | 3-material dichroic |
|---|---|---|
| Average Passband | 1.12% | 0.56% |
| Average Stopband | 87.84% | 90.47% |
| Metric value | 0.296 | 0.243 |

Thus, by employing three or more materials in the dichroic 4, one can create multiple dielectric pairs with different Brewster angles. For example, a stack made with $Ta_2O_5$ (approximate refractive index 2.165) and $SiO_2$ (approximate refractive index 1.457) will have a Brewster angle in the lower refractive index material, that is, $SiO_2$, of 56°, regardless of the thickness of the layers. However, the formula for the Brewster angle, corresponding to no reflectivity for p-polarized light, for any pair of materials in terms of refractive index is given by Equation (3):

$$\tan\theta_p = \frac{n_2}{n_1} \quad (3)$$

where $n_1$ and $n_2$ are the refractive indices of the two materials, and $\theta_p$ is the Brewster angle in the incident medium 1.

Figure 9:
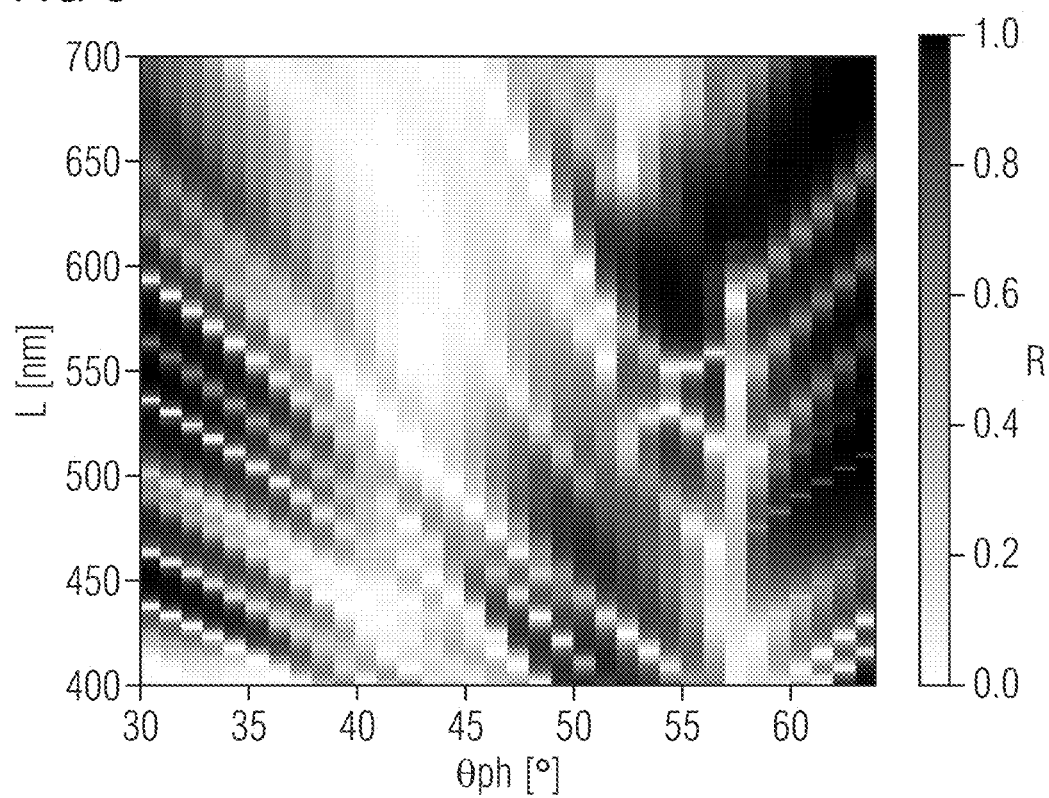
FIG. 9 shows a representation of reflectivity of an example of our Bragg mirror for optoelectronic semiconductor light sources.

For example, in the Brewster angle for Bragg pairs of $SiO_2/Ta_2O_5$ is 56° degrees, and for $MgF_2/Ta_2O_5$ it is 57.4°. A dichroic filter constructed, for example, by only Bragg pairs of $SiO_2/Ta_2O_5$, regardless of the details of the design, will have a Brewster window at that angle, and p-polarized light will escape. However, a dichroic constructed with two sets of disparate materials ($SiO_2/Ta_2O_5$ and, for example, indium tin oxide (ITO) (refractive index 1.858) and $MgF_2$ (refractive index 1.385)), will have two separate Brewster angles: one at 56° and the one associated with ITO/$MgF_2$ at 53°. Joined together as shown in FIG. 9, one of the two sets of pairs will have non-zero reflectivity at any angle, and so will no longer lose all photons at that angle. The Brewster condition occurs at an angle of incidence of about 41° for the $SiO_2/Ta_2O_5$ pair.

For the Bragg mirror 4 to work effectively, the two Brewster angles have to be sufficiently different so that one pair of materials provides reflectivity at the others Brewster window.

Figure 10:
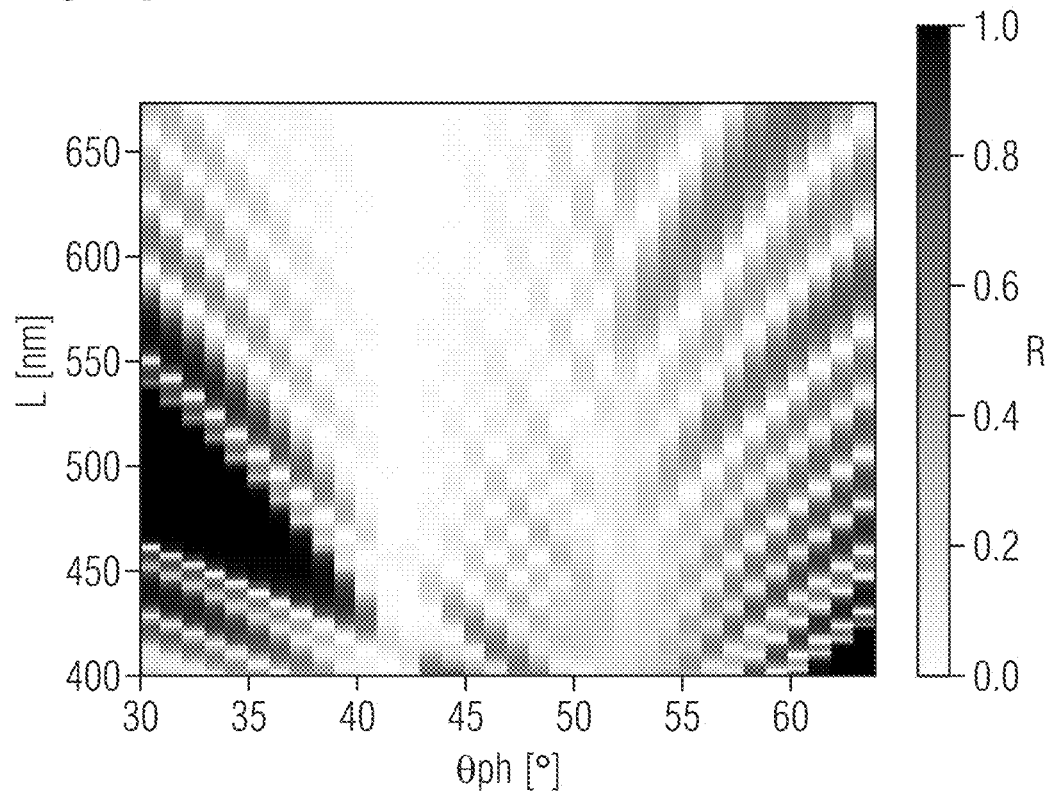
FIG. 10 shows a representation of reflectivity of a two material Bragg mirror for comparison to the examples.

For example, in the filter design shown in FIG. 9, the dichroic is constructed of Bragg pairs of $SiO_2/Ta_2O_5$ (Brewster angle 56°), and indium tin oxide (ITO)/$MgF_2$ (Brewster angle 53°). The corresponding reflectivity plots (FIG. 9, four-material, and FIG. 10, two-material $MgF_2/Ta_2O_5$) show that bottom overall transmittance is much higher for the single set of Bragg pairs. As the Brewster window for one pair is compensated by the reflectivity of the half-dichroic stack formed by the other pair, the overall structure has a much improved overall reflectivity. In FIGS. 9 and 10, the angle of incidence is for light incident from the phosphor side, the phosphor is a garnet like YAG, for example.

These dielectric layers are fabricated similarly to conventional dichroics via sputtering or thermal evaporation of very precise layers. A greater variety of materials is needed (at least three separate materials to have two distinct Bragg stacks), but otherwise fabrication is identical to typical dichroic filters.

The further apart the intrinsic Brewster angles, the better coverage can be achieved at the Brewster window. However, for many applications, there are not that many qualified optical coating materials with good transmission, varying refractive index, and able to withstand the necessary temperatures.

Figure 6:
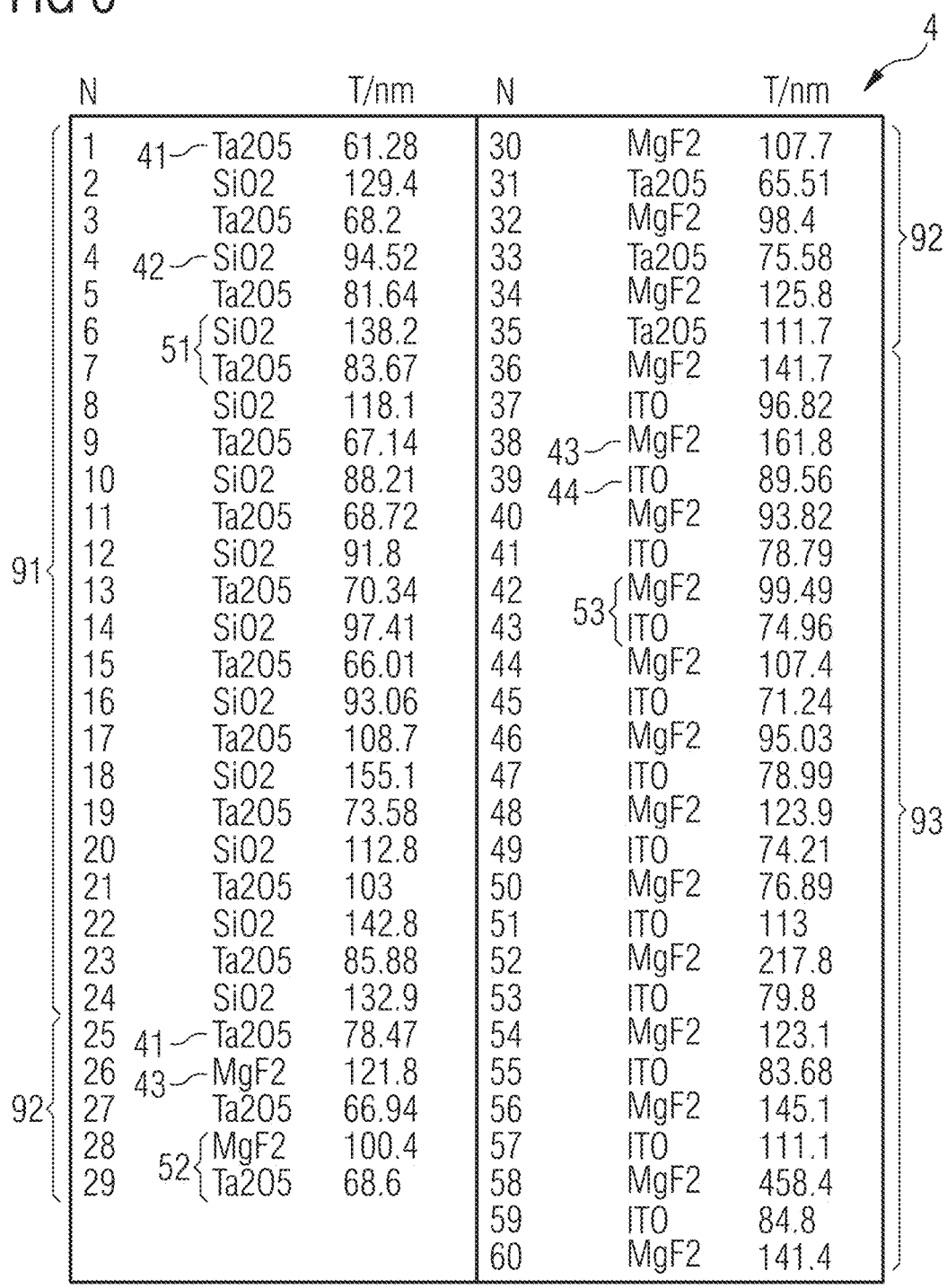
FIGS. 6 and 7 show schematic tabular representations of examples of our Bragg mirrors for optoelectronic semiconductor light sources.
Figure 7:
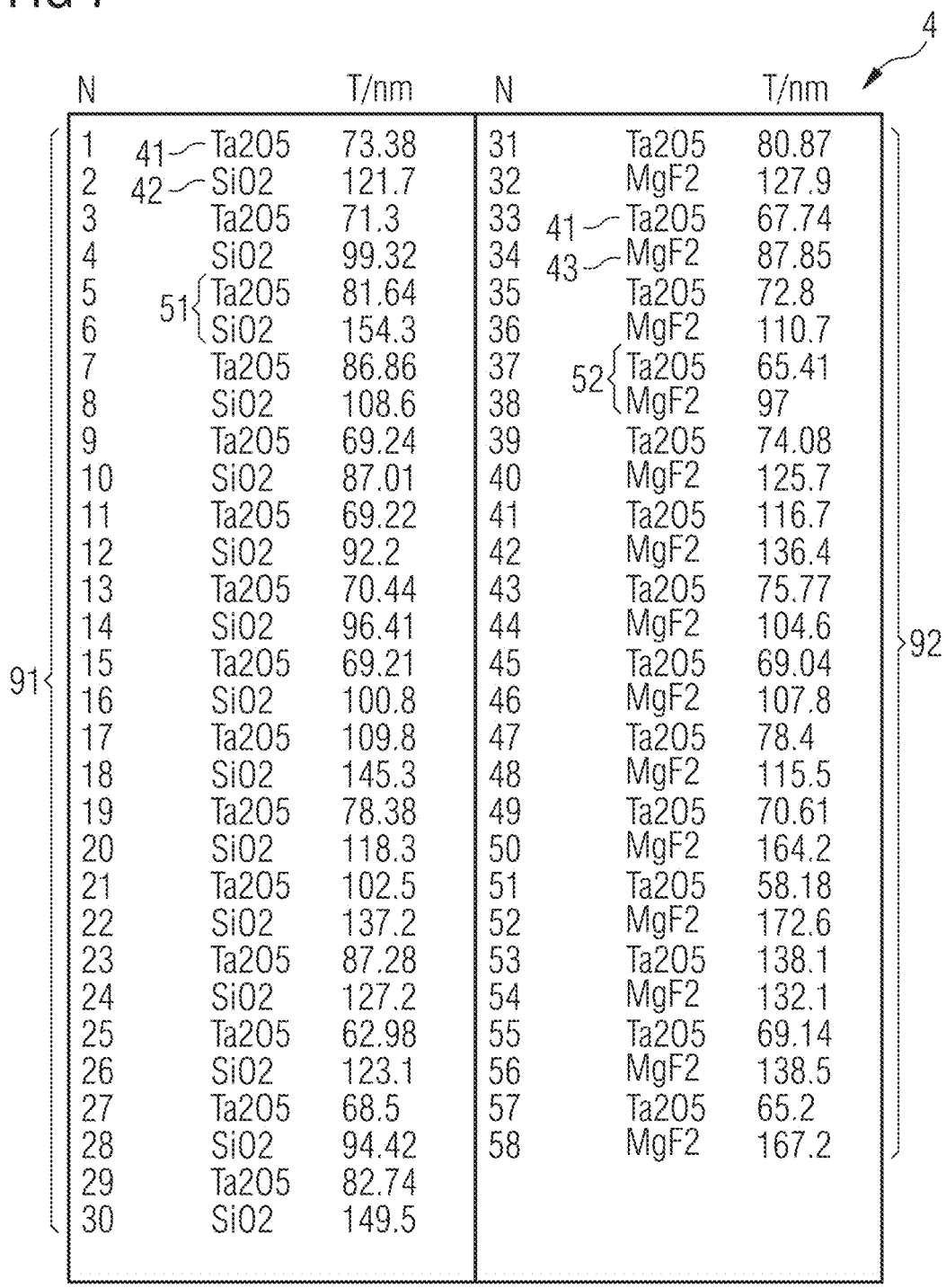

Details of the layers of exemplary dichroic coatings designed with different materials to cover the Brewster window are shown in FIGS. 6 and 7. These particular coatings are designed to have a passband in the blue spectral range at normal incidence, and be omnireflective at other wavelengths than for blue, at other angles.

The components shown in the figures follow, unless indicated otherwise, preferably in the specified sequence directly or indirectly one on top of the other. Layers not in contact in the figures are preferably spaced apart from one another. If lines are drawn parallel to one another, the corresponding surfaces are preferably oriented parallel to one another. Likewise, unless indicated otherwise, the positions of the drawn components relative to one another are correctly reproduced in the figures.

Our light sources and Brigg mirrors are not restricted by this description on the basis of the examples. Rather, this disclosure encompasses any new feature and also any combination of features including in particular any combination of features in the appended claims, even if the feature or combination itself is not explicitly specified in the claims or examples.

The invention claimed is:

1. An optoelectronic semiconductor light source comprising a semiconductor chip configured to emit primary radiation, a Bragg mirror, and
   a luminescence conversion element configured to convert at least part of the primary radiation into secondary radiation having a longer wavelength, wherein
   the Bragg mirror is arranged between the semiconductor chip and the luminescence conversion element,
   the Bragg mirror is reflective for the secondary radiation and transmissive for the primary radiation,
   the Bragg mirror comprises reflector layers of at least three different materials with different refractive indices,
   the Bragg mirror comprises at least two different kinds of layer pairs, each kind of layer pairs being made up of reflective layers of two different materials, and
   the different kinds of layer pairs having different Brewster angles for p-polarized radiation.

2. The optoelectronic semiconductor light source according to claim 1,
   wherein the Brewster angles differ by at least 1° so that, at the Brewster angle of one of the different kinds of layer pairs, at least one other kind of layer pairs has a reflectivity for the secondary radiation of at least 50%.

3. The optoelectronic semiconductor light source according to claim 1,
   wherein, at an angle of incidence of 0°,
   a reflectivity of the Bragg mirror is at most 2% in the wavelength range of the primary radiation, and
   an average reflectivity of the Bragg mirror in the wavelength range of the secondary radiation is at least 90%.

4. The optoelectronic semiconductor light source according to claim 1,
   wherein the Bragg mirror is configured for transmission of the primary radiation for angles of incidence of up to at least 40°, and
   the Bragg mirror is configured for reflectivity of the secondary radiation for angles of incidence of up to at least 65°.

5. The optoelectronic semiconductor light source according to claim 1,
   wherein the Bragg mirror comprises exactly two different kinds of layer pairs and comprises exactly three different materials for the reflective layers.

6. The optoelectronic semiconductor light source according to claim 1,
   wherein the Bragg mirror comprises exactly three different kinds of layer pairs and comprises exactly four different materials for the reflective layers.

7. The optoelectronic semiconductor light source according to claim 1,
   wherein the Bragg mirror comprises 3 to 30 layer pairs per kind of layer pairs, the secondary radiation has a spectral width of at least 80 nm, and
   the primary radiation has a spectral width of at most 30 nm.

8. The optoelectronic semiconductor light source according to claim 1,
   wherein, within each specific kind of layer pairs, thicknesses of the reflective layers of one of the materials vary by at least 20% of a maximum thickness of the respective reflective layers within said kind of layer pairs.

9. The optoelectronic semiconductor light source according to claim 1,
wherein the different kinds of layer pairs are arranged solely block by block so that the different kinds of layer pairs are not intermixed with each other and the blocks directly follow one another.

10. The optoelectronic semiconductor light source according to claim 1,
wherein at least 90% of the reflective layers have a thickness of 0.22 L/n to 0.45 L/n, at a wavelength L of 500 nm and n is the refractive index of the respective layer at a temperature of 300 K, and
the thickness of at least 10% of the reflective layers is at least 0.28 L/n.

11. The optoelectronic semiconductor light source according to claim 1,
further comprising a transmissive carrier, wherein the Bragg mirror is mounted onto the carrier,
the semiconductor chip is a laser diode chip,
the carrier is located between the semiconductor chip and the Bragg mirror,
the primary radiation travels through a gas or through an evacuated area prior to reaching the carrier, and
the primary radiation runs through the carrier prior to reaching the Bragg mirror.

12. The optoelectronic semiconductor light source according to claim 1,
further comprising an adhesive,
wherein the semiconductor chip is a light-emitting diode chip, and
the Bragg mirror is attached to the semiconductor chip by the adhesive so that the primary radiation runs through the adhesive prior to reaching the Bragg mirror.

13. The optoelectronic semiconductor light source according to claim 12,
wherein the adhesive has a refractive index of at most 1.55, at a wavelength of 500 nm and at a temperature of 300 K,
the adhesive comprises a silicone, and
a thickness of the adhesive is 0.5 µm to 10 µm.

14. The optoelectronic semiconductor light source according to claim 12,
wherein the adhesive has a refractive index of at least 1.7, at a wavelength of 500 nm and at a temperature of 300 K,
the adhesive comprises at least one of a glass and a metal oxide, and
a thickness of the adhesive is 0.2 µm and 4 µm.

15. The optoelectronic semiconductor light source according to claim 1,
wherein the Bragg mirror forms a cage all around the luminescence conversion element except for a light-exit side of the luminescence conversion element.

16. The optoelectronic semiconductor light source according to claim 1,
wherein the luminescence conversion element is a ceramic platelet,
the secondary radiation is green light or yellow light or orange light or red light, and the primary radiation is blue light or cyan-colored light or near-ultraviolet radiation.

17. The optoelectronic semiconductor light source according to claim 1,
wherein the materials of the reflector layers are at least one selected from the group consisting of: $SiO_2$, $Ta_2O_5$, $MgF_2$, ITO, ZnO, $CaF_2$, $BaF_2$, $Al_2O_3$, $TiO_2$, $ZrO_2$, $Y_2O_3$, $HfO_2$, $In_2O_3$, and $Nb_2O_5$.

18. A Bragg mirror for an optoelectronic semiconductor light source comprising:
a plurality of reflector layers of at least three different materials with different refractive indices, and
at least two different kinds of layer pairs, each kind of layer pairs being made up of reflective layers of two different materials, wherein
the Bragg mirror is reflective for at least one of green, yellow, orange and red light and transmissive for at least one of blue light, cyan-colored light and near-ultraviolet radiation, and
the different kinds of layer pairs have different Brewster angles for p-polarized radiation.

* * * * *